US008789989B2

(12) United States Patent
Demma

(10) Patent No.: US 8,789,989 B2
(45) Date of Patent: *Jul. 29, 2014

(54) DISPLAY SWITCH UNIT FOR A VEHICLE AND METHOD FOR PRODUCING THE DISPLAY SWITCH UNIT

(75) Inventor: Dino Demma, Ruesselsheim (DE)

(73) Assignee: GM Global Technology Operations LLC, Detroit, MI (US)

( * ) Notice: Subject to any disclaimer, the term of this patent is extended or adjusted under 35 U.S.C. 154(b) by 131 days.

This patent is subject to a terminal disclaimer.

(21) Appl. No.: 13/441,325

(22) Filed: Apr. 6, 2012

(65) Prior Publication Data

US 2012/0257416 A1 Oct. 11, 2012

(30) Foreign Application Priority Data

Apr. 8, 2011 (DE) .......................... 10 2011 016 429

(51) Int. Cl.
*F21V 9/00* (2006.01)
(52) U.S. Cl.
USPC ............ 362/511; 362/487; 362/488; 362/489
(58) Field of Classification Search
USPC ................................................. 362/459–549
See application file for complete search history.

(56) References Cited

U.S. PATENT DOCUMENTS

| 6,144,424 | A | 11/2000 | Okuda et al. |
| 7,793,448 | B1 | 9/2010 | Huang et al. |
| 7,868,778 | B2 | 1/2011 | Kenwright |
| 8,099,209 | B2 | 1/2012 | Tschirhart |
| 2008/0122661 | A1 | 5/2008 | Han |
| 2010/0066254 | A1 | 3/2010 | Ott et al. |
| 2012/0255846 | A1* | 10/2012 | Demma ........................ 200/5 A |

FOREIGN PATENT DOCUMENTS

| DE | 9403322 U1 | 9/1994 |
| DE | 102006017067 A1 | 10/2007 |
| DE | 102006061164 A1 | 6/2008 |
| DE | 102007061533 A1 | 6/2009 |
| DE | 102009026902 A1 | 1/2010 |
| EP | 0778440 B1 | 11/2002 |
| EP | 1767986 A1 | 3/2007 |
| EP | 1926213 A2 | 5/2008 |
| WO | 2004006214 A1 | 1/2004 |
| WO | 2007035115 A1 | 3/2007 |
| WO | 2009089092 A1 | 7/2009 |

OTHER PUBLICATIONS

German Patent Office, German Search Report dated Feb. 3, 2012 for German Application No. 102011016429.4.

* cited by examiner

*Primary Examiner* — William Carter
(74) *Attorney, Agent, or Firm* — Ingrassia Fisher & Lorenz, P.C.

(57) ABSTRACT

A display switch unit is provided for a vehicle comprising at least one first and one second light guide plate with first and second light sources disposed at the edges. The light guide plates have switch symbols and proximity sensors having sensor structures. The first light guide plate and the second light guide plate are disposed on one another. Respectively one sensor structure is assigned two switch symbols in both light guide plates. The material of the switch symbols is a plastic with light-sensitive nanoparticles, which is arranged distributed in the light guide plates in such a manner that under edge-side irradiation the switch symbols are visible illuminated in color and three-dimensionally in the light guide plates.

19 Claims, 4 Drawing Sheets

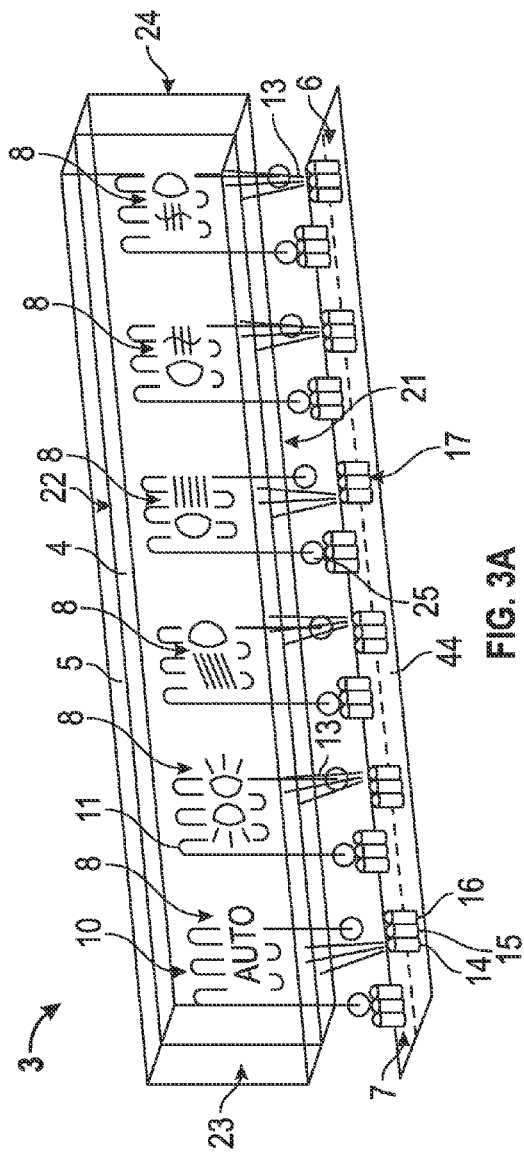
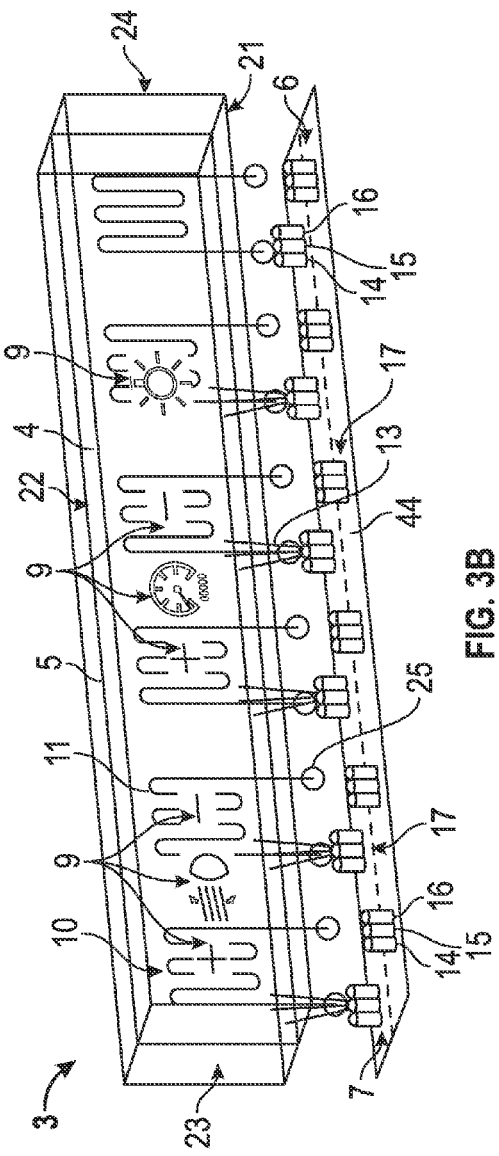

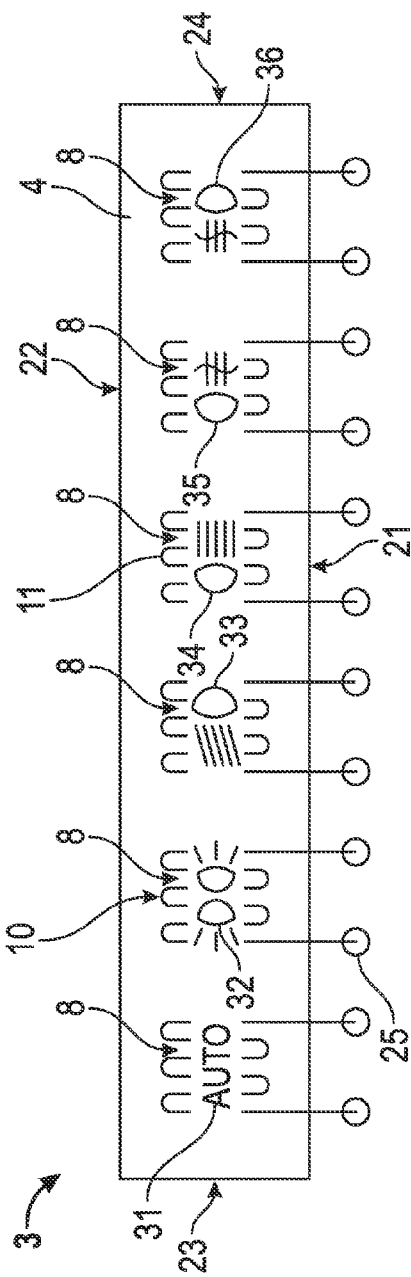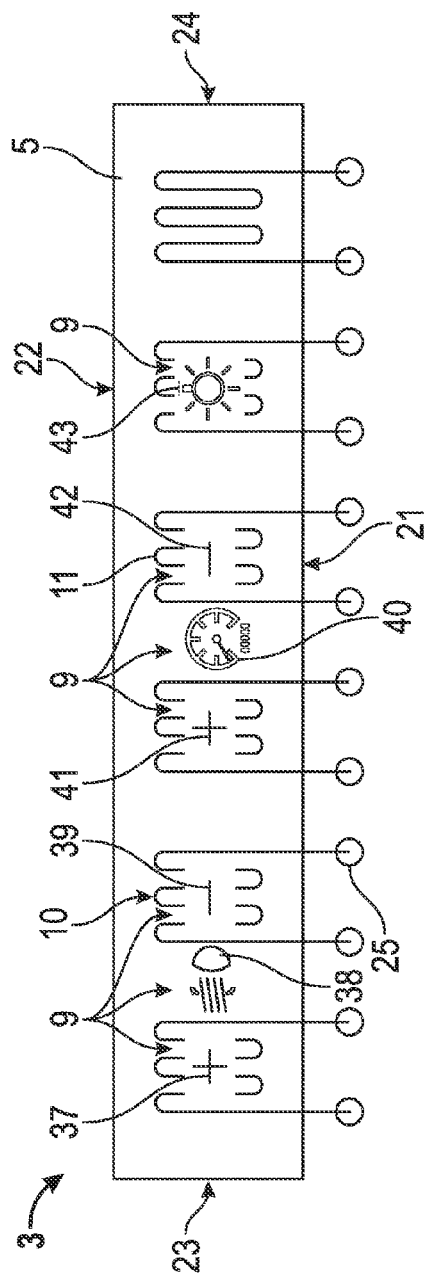
FIG. 4A
FIG. 4B

DISPLAY SWITCH UNIT FOR A VEHICLE AND METHOD FOR PRODUCING THE DISPLAY SWITCH UNIT

CROSS-REFERENCE TO RELATED APPLICATION

This application claims priority to German Patent Application No. DE 10 2011 016 429.4, filed Apr. 8, 2011, which is incorporated herein by reference in it's entirely.

TECHNICAL FIELD

The technical field generally relates to a display switch unit for a vehicle comprising at least one first and one second light guide plate having first and second light sources disposed at the side edges.

BACKGROUND

Known from the document EP 0 778 440 B1 is a color display device having a light guiding part comprising a pair of interconnected wedge-shaped light guide plates. The light sources are each disposed in different colors so that they lie opposite one edge of each of the wedge-shaped light guide plates. In this case, the light from wedge-shaped light guide plates is coupled out through transparent coatings of the same as a result of a different refractive index onto the coatings opposite the wedge-shaped light guide plates. In this case, the coatings can have different structures or be constructed from liquid crystals. Furthermore, in a unified color display device, actuating sections are provided in a dashboard, which comprise a transparent contact field switch, where the color display device rests on the transparent contact field switch, and a driver circuit for driving the control section is provided in a control section for controlling the transparent contact field switch and the color display device.

As a result of the structure and the setup of this color display device, only layered or flat switch symbols can be made available to the driver. In addition, the switch symbols are mounted in layers between the two wedge-shaped light guide plates so that a 3-D representation of the switch symbols is almost impossible. It is true that a polychromatism between the plates can be achieved by different colored edge-side irradiation of the wedge-shaped light guide plates and therefore polychromatism of the switch symbols shown can also be achieved, but it remains the case that these switch symbols are of a flat nature.

Particularly for vehicles, the design options for display devices are restricted to different-colored backlights although there is a need on the part of the manufacturers to differentiate their vehicles and provide unique style and design types, particularly with reference to look and feel. Since the available possibilities for display have been limited for years, the scope for style and design for differentiating and characterizing vehicles is extremely restricted in this area.

It is at least one object to overcome these limits and provide a display switch unit for a vehicle and a method for producing the display switch unit, which extends the possibilities of style and design type for such vehicles and improves the operating comfort in a vehicle. In addition, other objects, desirable features and characteristics will become apparent from the subsequent summary and detailed description, and the appended claims, taken in conjunction with the accompanying drawings and this background.

SUMMARY

A display switch unit is provided for a vehicle comprising at least one first and one second light guide plate with first and second light sources disposed at the edges is described. The light guide plates have switch symbols and proximity sensors having sensor structures. One sensor structure each is disposed behind one of the plastic switch symbols. The first light guide plate and the second light guide plate are disposed on one another. The material of the plastic switch symbols comprises light-sensitive nanoparticles, which are arranged distributed in the light guide plates in such a manner that under edge-side irradiation the colored illuminated three-dimensional switch symbols are visible in the light guide plates.

The display switch unit consequently has the advantage that by switching from a first light source to a second light source, different switch symbols of this display switch unit light up and thus enable a greater plurality of switching possibility for the driver. The light guide plates can have any basic shape, but at least two opposite flat plates are parallel to one another as is usual in plate construction. The plate upper sides are aligned perpendicular or at a preferred angle to the field of view of the driver. With a specific arrangement of the light coupling-out structures in the form of switch symbols, numbers, letters, symbols, and/or graphics can light up in the individual light guide plates.

In this case, the numbers, letters, symbols, and/or graphics can be arranged as hollow body surfaces or as tightly packed agglomerations in the light guide plate body. The crucial thing is only that here the material of the switch symbols differs from the surrounding material of the light guide plates in that, in the unilluminated state, light-sensitive nanoparticles disposed in the volume of the three-dimensional switch symbols do not light up and colored illuminating three-dimensional switch symbols only become visible in the light guide plates under edge-side irradiation.

Consequently, the light coupling-out structures in the form of switch symbols are invisible for the eye as long as they are not illuminated and can only light up in color when light is introduced. Depending on the operating requirements, the first or the second light guide plate can be displayed as a luminous plane with lighting technology. Furthermore, fine wires can be let into the light guide plates, which allow an actuation process to be triggered with an external evaluation unit, for example, a change in capacitance of a capacitor in an RC oscillating circuit when, for example, a finger is brought close. Depending on the switched-on and illuminated light guide plate, the wire of the respective switch symbol of the light guide plate functions as a receiver for a switch command.

To this end, the light guide plates can be joined together to form a composite, where it is also possible that each of the light guide plates comprises an electrically transparent conducting coating structure instead of fine wire structures. The change between the illuminating guide plates can be accomplished with at least one switch and can simultaneously be displayed to the user by a plurality of illuminating colors.

The light guide plate can in each case be exposed to a basic illumination. In addition, the switch symbols can be illuminated with various colors so that the user can perceive visually which of the switch symbols or switch functions is active or passive. In addition, this actuation process can be acknowledged visually and/or haptically. By placing at least two light guide plates one upon the other, two layers of switch symbols to be switched are formed in a common installation space of the vehicle so that a plurality of switch symbols can be selected via a selector switch, which is attractive and high-quality for the user. Furthermore, the manufacturing costs are reduced, especially as a common evaluation unit is required for the sensors. In addition, such a multilayer display switch unit can be disposed in the field of view of the driver, which brings with it further stylistic and installation-space advantages.

In a further embodiment, the first light source and the second light source can have different colors in which the switch symbols light up. On the other hand, it is also possible that the first light source and the second light source emit white light and the first and second switch symbols light up in the first and second light guide plate when irradiated with white light in different colors, which merely depends on the light-sensitive properties of the nanoparticles contained in the volume of the three-dimensional switch symbols. On the other hand, it is also possible to provide a plurality of different-colored light sources for each individual switch symbol in the form of, for example, different-colored light-emitting diodes.

In order to represent three-dimensional switch symbols in the light guide plates, these switch symbols can be prepared from a preformed colored illuminating plastic having light-sensitive nanoparticles distributed in the volume and embedded in the transparent plastic mass of the light guide plates. In addition, it is possible to equip each light guide plate with different-colored edge-side light sources, which makes the switch symbols light up in switch position display colors such as red, green, and yellow. In this case, the color red can symbolize the switched-off state, the color green the switched-on state, and yellow the ready state of the switch symbols.

For the sensor structures, in a further embodiment invisible electrically conducting layer structures connected to electrical connections on one edge side of the light guide plates are provided so that a corresponding sensor circuit can be connected from outside. As has already been mentioned above, these structures can be configured so that they resemble capacitor plate structures so that a capacitive coupling with, for example, an actuating finger of the vehicle driver can trigger the switching process. In this case, the sensor structures can be differently configured, specifically as a strip structure or as a meander structure and consist of a transparent electrically conducting structured indium oxide or structured iron oxide coating. It is further provided that the sensor structure has a direction identification so that operating functions such as changes in seat heating, ventilation, temperature, air conditioning settings can be differently adjusted individually for the driver and the passenger side.

In addition, one or more circuit boards with the electronics for the sensor structure can be disposed as nontransparent additional layers on the rear side of the rear light guide plate. Further, it is possible to provide a third light guide plate which has homogeneously distributed light-sensitive nanoparticles and is illuminated from its edge sides via light sources so that a backlighting of the display unit becomes possible. Such a backlight can have a reflector film on its rear side in order to ensure that the back-scattered light is reflected by the light-sensitive nanoparticles to the front side of the display unit. In addition, such a light guide plate equipped with homogeneously distributed light-sensitive nanoparticles can have edge-side light sources which are supplied with power differently for daytime operation and for night-time operation so that during daytime operation a brighter backlighting lights up than for night-time operation.

A method for producing a display switch unit for a vehicle comprises the following process steps. Dimensionally stable three-dimensional transparent plastic switch symbols are initially produced from a plastic compound that can be excited to light up in color. Then these dimensionally stable three-dimensional plastic switch symbols are embedded in at least one first and one second transparent light guide plate. In addition, transparent electrically conducting coatings are applied to a rear side of the light guide plates and structured to form sensor structures of proximity sensors. Finally the first and second transparent light guide plates are assembled with switch symbols and proximity switch sensor structures to form a display switch unit for a vehicle. This assembly can consist in a seamless joining, where a transparent adhesive is usually used.

Three-dimensional plastic switch symbols can be embedded with potting the three-dimensional plastic switch symbols in pre-fabricated recesses of a light guide plate under vacuum. In addition, it is possible to produce the dimensionally stable three-dimensional plastic switch symbols with gluing of the switch symbols into prepared recesses of a light guide plate. The application of sensor structures of the transparent electrically conducting coatings can be accomplished by means of spraying, vapor deposition, PVD (physical vapor deposition), or CDV (chemical vapor deposition) methods and subsequent selective etching to form a sensor structure or by laser writing.

In addition, other objects, desirable features and characteristics will become apparent from the subsequent summary and detailed description, and the appended claims, taken in conjunction with the accompanying drawings and this background.

BRIEF DESCRIPTION OF THE DRAWINGS

The present invention will hereinafter be described in conjunction with the following drawing figures, wherein like numerals denote like elements, and:

FIG. 3A and FIG. 3B schematic perspective views of the display switch unit according to FIG. 2; and FIG. 4A and FIG. 4B schematic front views of the first and second light guide plate with switch symbols and with position of the proximity sensors.

DETAILED DESCRIPTION

The following detailed description is merely exemplary in nature and is not intended to limit application and uses. Furthermore, there is no intention to be bound by any theory presented in the preceding background or summary or the following detailed description.

Figure 1:
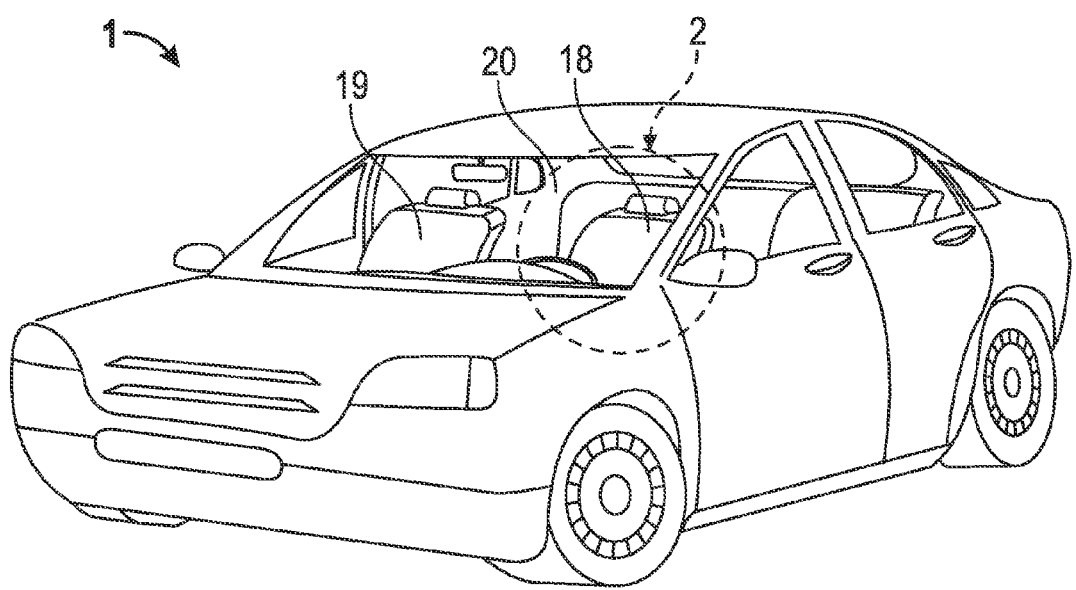
FIG. 1 shows a schematic view of a vehicle having a display unit in a vehicle driver area.

FIG. 1 shows a schematic view of a vehicle 1 having a display switch unit in a vehicle driver area 2, which is marked by a circle. Located in the vehicle driver area 2 are components and functions of the vehicle 1 in the interior 20 which are disposed in the operating range of the vehicle driver so that the vehicle driver can operate the display switch unit from his driver's side 18. It is also provided that the passenger has access to the display switch unit from his passenger side 19.

Figure 2A:
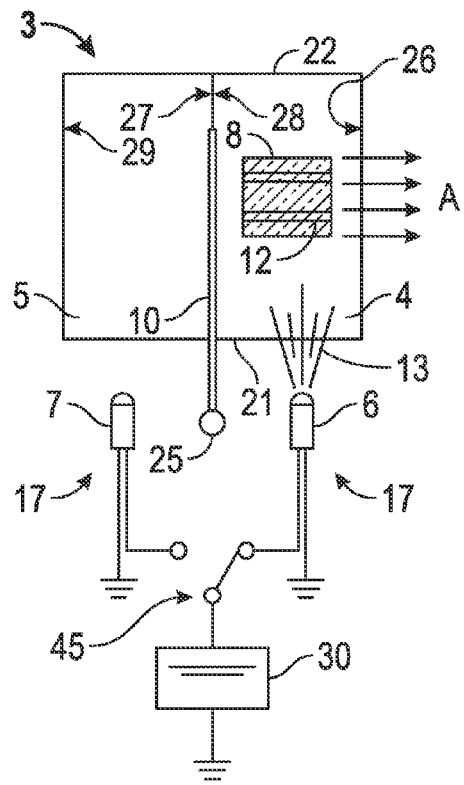
FIG. 2A and FIG. 2B schematic cross-sections through a display switch unit.
Figure 2B:
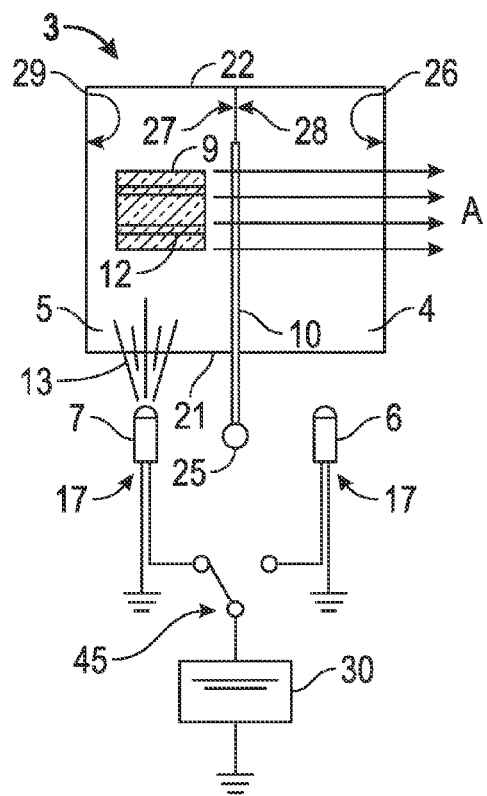

FIG. 2A and FIG. 2B schematic cross-sections through a display switch unit 3. Two different operating states of the new display switch unit 3 are shown with FIG. 2A and FIG. 2B. In FIG. 2A a first light guide plate 4 of the display switch unit 3 is active and in FIG. 2B a second light guide plate 5 is active. Proximity sensors 10 jointly active for both light guide plates 4 and 5 are disposed between the first and the second light guide plates 4 and 5, which are used to trigger switch functions when a hand approaches.

To this end, the display switch unit 3 is constructed of at least two transparent light guide plates 4 and 5, where the first light guide plate 4 is provided as front light guide plate and has a front side 26 while the second light guide plate 5 with its front side 27 contacts the rear side 28 of the front light guide plate 4 insofar as these sides 27 and 28 are free from sensor structures of the interposed proximity sensors 10. The second rear light guide plate 5 has a rear side 29, which in this embodiment already forms the rear side of the display switch unit 3.

However, further plates and boards can be disposed on this rear side of the display switch unit 3 in order, for example, to accommodate electrics with control circuits, driver circuits, inter alia, for the display switch unit 3. Also a reflector film can be disposed on the rear side 29 of the display switch unit 3 in order to intensify the luminous effect of light-sensitive nanoparticles 12.

Such light-sensitive nanoparticles 12 are exclusively provided in the volume of three-dimensional switch symbols 8 or 9 shown in FIG. 2A or FIG. 2B and scatter light coupled in at the edge in such a manner that the switch symbols 8 or 9 embedded invisibly in the light guide plates 4 or 5 light up. The switch symbols 8 or 9 embedded in the light guide plates 4 or 5 only become visible due to the emitting light sources 6 or 7 located at the edge.

In this embodiment, as shown in FIG. 2A, the switch symbols 8 are embedded in the front first light guide plate 4 and non-visible switch symbols are embedded in the rear second light guide plate 5. One switch symbol 8 of the first light guide plate 4 is excited in FIG. 2A by a first light source 6 disposed on a lower edge side 21 of the light guide plate 4 with irradiation 13 for illuminating so that the light-sensitive nanoparticles 12 of the switch symbol 8 light up so that the switch symbol 8 becomes visible in the direction of the arrow A on the front side 26. The switch symbols disposed in the rear second light guide plate 5 still remain invisible in this case.

This illumination in the direction of the arrow A by the light-sensitive nanoparticles 12 of the switch symbol 8, which is not visible in the unilluminated state, is achieved in FIG. 2A by a first light source 6 with the aid of light-emitting diodes 17, which are disposed on the lower edge side 21 of the light guide plate 4 and are connected via a switch element 45 to a power source 30. The irradiation 13 by the light source 6 with the aid of light-emitting diodes 17 is therefore accomplished from one of the edge sides of the first light guide plate 4 and as a result of the light-sensitive nanoparticles 12 in the switch symbol 8, this light is scattered in the direction of the arrow A onto the front side 26 of the display switch unit 3. The light source 6 could alternatively also be disposed on an upper edge side 22.

The proximity sensor 10 embedded between the first light guide plate 4 and the second light guide plate 5 is connected via an electrical connection 25 to control electronics or driver electrics. This proximity sensor is capacitive or coupled to an LC oscillatory circuit of the control electronics so that a resonance frequency is capacitance varied by approach of a hand or a finger and a switch function of the switch symbol 8 can thus be activated or triggered.

Whereas in FIG. 2A the switch symbol 8 of the front first light guide plate 4 lights up as "switch-ready", by means of the light source 6 in the direction of the arrow A, it is shown in FIG. 2B that after switching the power source 30 by means of the connection 25, the switch symbol 9 of the rear light guide plate 5 lights up toward the front side 26 in the direction of the arrow A. In this case, the switch symbols of the front first light guide plate 4 remain almost invisible.

The illumination of the switch symbol 9 shows the readiness that the switch function of the switch symbol 9 of the rear second light guide plate 5 can now be triggered or activated by the same proximity sensor 10. Such a proximity sensor 10 is consequently not only disposed in the center between the two light guide plates 4 and 5 but, depending on the switch position of the connection 25, can trigger or activate the switch function of a front or a rear switch symbol 8 or 9. Accordingly one proximity sensor 10 each is to be provided for respectively one pair of switch symbols in the first and the second light guide plate 4 or 5 in a space- and material-saving manner, as shown in the next following figures.

FIG. 3A and FIG. 3B schematic perspective views of the display switch unit 3 according to FIG. 2. In addition, a board 44 with first light sources 6 and second light sources 7, which can each illuminate the lower edge side 21 of a light guide plate 4 or 5, is disposed opposite the lower edge side 21 of the display switch unit 3. In this version shown in FIG. 3A three light-emitting diodes each for the three-dimensional switch symbols 8 are provided, with the color red by the colored light source 14, with the color magenta by the colored source 15, and green by the colored light source 16.

Consequently, these colored light sources 14 to 16 can cause the switch symbols 8 in the first light guide plate 4 to light up in these three colors, where the red light source 14 signals that the switch function of the switch symbol 8 is not switched on, the magenta light source 15 symbolizes that the switch symbol is ready to switch, and the green light source 16 symbolizes that the switch function of the switch symbol 8 is in a switched-on state.

Accordingly, colored illuminating beams are provided by the respectively three light sources 14, 15, and 16 per switch symbol on the board 44 and as shown in FIG. 3A only the low beam is switched on by the switch symbols 8, high beam is switched off, the tail lights and the rear fog lights are ready, the parking and vehicle lighting is switched on while an automatic headlamp activation is switched off. Since the switch symbols of the rear second light guide plate 5 in FIG. 3A are not irradiated by the second light sources 7, they remain invisible.

With FIG. 3B, the rear switch symbols 9 of the rear light guide plate 5 are activated so that the light height of the low beam can be changed with the aid of the switch symbols – and +, or the dashboard lighting can be controlled with the aid of switch symbols – or +, or it is possible to switch the interior lighting on or off. For this purpose, a rear row of light-emitting diodes each having three light sources 14, 15, and 16 per switch symbol 9 can light up with the aid of the second light sources 7 and the switch symbols in the second light guide plate 5 can light up in different colors so that the switch functions of the rear switch symbols 9 can be activated with the same proximity switches, as already shown in FIG. 3A. Which switch function has just been activated can be identified by means of the irradiation 13 shown. In order to achieve an activation of the switch functions, it is not sufficient to make the switch symbols 8 or 9 light up, but a driver or activation circuit must act in parallel on the electrical connections 25 of the proximity sensors 10.

FIG. 4A and FIG. 4B schematic front views of the first and second light guide plate 4 and 5 with switch symbols 31 to 43 and with positions of proximity sensors 10. In this case, the proximity sensors 10 can each activate two switch symbols 8 or 9 of the front light guide plate 4, as shown in FIG. 4A, or of the rear light guide plate 5, as shown in FIG. 4B. Therefore, in principle, the number of required proximity sensors 10 is halved. In FIG. 4A for example, six switch symbols 8 are provided, which can be actuated by means of accordingly six sensor structures 11.

The proximity sensors 10 have meander-shaped sensor structures 11 for this purpose, but strip-shaped sensor structures are also possible which in turn for their part can have a meander shape or a strip shape. Such structures can comprise structured electrically conducting translucent coatings of indium oxide or iron oxide. However it is also possible to insert thin wires in a meander shape between the two light guide plates 4 and 5 and guide these out for example as here, on the lower edge from the region between the guide plates 4 and 5 and provide them with connections 25.

In the six positions of the switch symbols in FIG. 4a, an automatic light switch is firstly shown by the switch symbol 31 which can be activated in order to ensure that the vehicle headlamps are automatically switched on in the dark. The parking or marker lighting of the vehicle can be activated with the switch symbol 32. The low beam is switched on and off with the switch symbol 33 and the high beam is actuated with the switch symbol 34 or its switching state is confirmed by the aforementioned switching colors. The switch symbols 35 and 36 enable a rear fog light or a fog lamp to be activated.

The switch functions of the switch symbols of the first light guide plate 4 can be deactivated by switching to the rear light guide plate 5 as shown in FIG. 4B. In FIG. 4B it is provided that the same proximity sensors 10 as in FIG. 4A can activate further switch functions of the switch symbols 9. For this purpose the switch symbol 38 can be seen in FIG. 4B which shows that the light height adjustment of the low beam as shown by the switch symbol 38 can be varied with the switch symbol 37, a plus sign, and the illuminating switch symbol 39, a minus sign. The next two proximity sensors 10 are in turn fitted with a plus switch symbol 41 and a minus switch symbol 42 with which the brightness of the instrument lighting can be varied. Finally, the interior lighting can be switched on or off or varied with the aid of the switch symbol 43. Such switch symbol functions can be extended as desired. This only depends on the size of the light guide plates layered onto one another While at least one exemplary embodiment has been presented in the foregoing summary and detailed description, it should be appreciated that a vast number of variations exist. It should also be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing an exemplary embodiment, it being understood that various changes may be made in the function and arrangement of elements described in an exemplary embodiment without departing from the scope as set forth in the appended claims and their legal equivalents.

What is claimed is:

1. A display switch unit for a vehicle comprising:
   a first light guide plate having a first light source disposed at an edge side;
   a second light guide plate having a second light source disposed at the edge and disposed on the first light guide plate;
   a plurality of switch symbols disposed in the first light guide plate and the second light guide plate; and
   a plurality of proximity sensors having a sensor structure, wherein the sensor structure is assigned switch symbols in both light guide plates,
   wherein a material of the plurality of switch symbols comprises a plastic with a plurality of light-sensitive nanoparticles, and
   wherein the plurality of light-sensitive nanoparticles are distributed in the first light guide plate and the second light guide plate such that under edge-side irradiation the plurality of switch symbols are visible illuminated in color and three-dimensionally.

2. The display switch unit according to claim 1, wherein the first light source and the second light source have different colors.

3. The display switch unit according to claim 2, wherein the first light source and the second light source are configured to emit a white light and a first switch symbol and a second switch symbol light up in the first light guide plate and the second light guide plate when irradiated with the white light in different colors.

4. The display switch unit according to claim 3, wherein the first switch symbol comprises a preformed colored illuminating plastic having light-sensitive nanoparticles distributed in a volume and embedded in a transparent plastic mass of the first light guide plate and the second light guide plate.

5. The display switch unit according to claim 1, wherein the first light guide plate and the second light guide plate has different-colored edge-side light sources that are configured to light up the plurality of switch symbols in switch position display colors.

6. The display switch unit according to claim 1, wherein the first light guide plate and the second light guide plate have light-emitting diodes disposed at the edge as a light source.

7. The display switch unit according to claim 1,
   wherein the sensor structure comprises substantially invisible electrically conducting layer structures, and
   wherein the substantially invisible electrically conducting layer structures are connected to electrical connections on one edge side of the first light guide plate and the second light guide plate.

8. The display switch unit according to claim 1, wherein the sensor structure comprises a capacitor structure.

9. The display switch unit according to claim 1, wherein the sensor structure is a strip structure or a meander structure made of a transparent electrically conducting structured indium oxide or structured iron oxide coating.

10. The display switch unit according to claim 1, wherein the sensor structure is a strip structure that is at least partially formed of a transparent electrically conducting structured oxide coating.

11. The display switch unit according to claim 1, wherein the sensor structure has a direction identification so that operating functions are individually adjustable for a first side and a second side.

12. The display switch unit according to claim 1, wherein a circuit board with electronics for the sensor structure are disposed as a nontransparent additional layer on a rear side of rear light guide plate.

13. A method for producing a display switch unit for a vehicle, comprising:
   producing dimensionally stable three-dimensional transparent plastic switch symbols formed at least partially of a plastic compound that comprises a plurality of light-sensitive nanoparticles that are configured to light up in color when excited;
   embedding the dimensionally stable three-dimensional transparent plastic switch symbols in a first light guide plate and as second light guide plate;

applying a transparent electrically conducting coating to a rear side of the first light guide plate and the second light guide plate;
structuring the coating to form sensor structures of proximity sensors;
assembling the first light guide plate and the second light guide plate with a switch symbol and a sensor structure.

14. The method according to claim 13, wherein three-dimensional plastic switch symbols are embedded by potting the three-dimensional plastic switch symbols in pre-fabricated recesses of a light guide plate under vacuum.

15. The method according to claim 13, wherein the dimensionally stable three-dimensional transparent plastic switch symbols are embedded by of gluing the switch symbol into prepared recesses of a light guide plate.

16. The method according to claim 13, wherein the applying and the structuring of the transparent electrically conducting coating for sensor structures is accomplished by spraying and subsequent selective etching to form the sensor structure.

17. The method according to claim 13, wherein the applying and the structuring of the transparent electrically conducting coating for sensor structures is accomplished by vapor deposition and subsequent selective etching to form the sensor structure.

18. The method according to claim 13, wherein the applying and the structuring of the transparent electrically conducting coating for sensor structures is accomplished by PVD and subsequent selective etching to form the sensor structure.

19. The method according to claim 13, wherein the applying and the structuring of the transparent electrically conducting coating for sensor structures is accomplished by CDV and subsequent selective etching to form the sensor structure.

* * * * *